(12) United States Patent
Lin

(10) Patent No.: US 7,819,692 B2
(45) Date of Patent: Oct. 26, 2010

(54) FRAME FOR ELECTRICAL CONNECTOR

(75) Inventor: Chun-Fu Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/477,150

(22) Filed: Jun. 3, 2009

(65) Prior Publication Data
US 2009/0298330 A1    Dec. 3, 2009

(30) Foreign Application Priority Data
Jun. 3, 2008   (TW) .............................. 097209724

(51) Int. Cl.
*H01R 13/60* (2006.01)
(52) U.S. Cl. .................................................. 439/527
(58) Field of Classification Search ................ 439/527, 439/535, 342, 331
See application file for complete search history.

(56) References Cited

U.S. PATENT DOCUMENTS

| 4,874,904 A | * | 10/1989 | DeSanti | ........................ | 174/53 |
|---|---|---|---|---|---|
| 5,954,448 A | * | 9/1999 | Shim | ........................ | 403/291 |
| 6,971,902 B2 | * | 12/2005 | Taylor et al. | ................ | 439/342 |
| 7,374,446 B2 | * | 5/2008 | Toda et al. | ................... | 439/342 |
| 7,637,772 B2 | * | 12/2009 | Wang | ......................... | 439/536 |
| 2004/0014356 A1 | * | 1/2004 | Hallitschke et al. | ......... | 439/527 |
| 2004/0235342 A1 | * | 11/2004 | Tarkoff et al. | ............... | 439/527 |

* cited by examiner

*Primary Examiner*—Jean F Duverne
(74) *Attorney, Agent, or Firm*—Andrew C. Cheng; Wei Te Chung; Ming Chieh Chang

(57) ABSTRACT

A frame (1) for engaging with a connector (2) includes a first pair of opposite retaining walls (13), a second pair of opposite retaining walls (12) and an opening (11). The opening (11) is surrounded by the first and the second retaining walls. The frame is detachable from the connector and at least one pair of the first and second pairs (13, 12) of opposite retaining walls are fixed on the lateral sides of the electrical connector. Wherein at least one retaining wall which is fixed to the electrical connector, defines a cutout (120, 130), and the cutout (120, 130) is disposed on middle portion of the retaining wall and communicates with the opening (11).

10 Claims, 6 Drawing Sheets

FRAME FOR ELECTRICAL CONNECTOR

BACKGROUND OF THE INVENTION

1. Field of the Invention

The present invention relates to a frame for an electrical connector, and in particular to a frame detachable from an electrical connector.

2. Description of Prior Arts

Usually, an electrical connector for receiving a CPU (central processing unit) is disposed on a PCB (print circuit board). And a plurality of terminals received in the electrical connector to create an electrical path from the connector to the corresponding traces of the PCB. The CPU will electrically connect to the PCB by the plurality of terminals. The electrical connector has a detachable frame. The frame is molded out of resin from molten plastic material, and will warp as it is cooling down to room temperature. The warped frame will engage with the electrical connector as they are assembled together. That is, the warped frame had to assemble to the electrical connector and the speed of the assembling will low.

Therefore, it is desirable to provide a new frame for the electrical connector that eliminates the aforesaid problems.

SUMMARY OF THE INVENTION

Accordingly, an object of the present invention is to provide a frame which can prevent warping.

To achieve above-described object, a frame for engaging with a connector includes a first pair of opposite retaining walls, a second pair of opposite retaining walls and an opening. The opening is surrounded by the first and the second retaining walls. The frame is detachable from the connector and at least one pair of the first and second pairs of opposite retaining walls are fixed on the lateral sides of the electrical connector. Wherein at least one retaining wall which is fixed to the electrical connector, defines a cutout, and the cutout is disposed on middle portion of the retaining wall and communicates with the opening.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
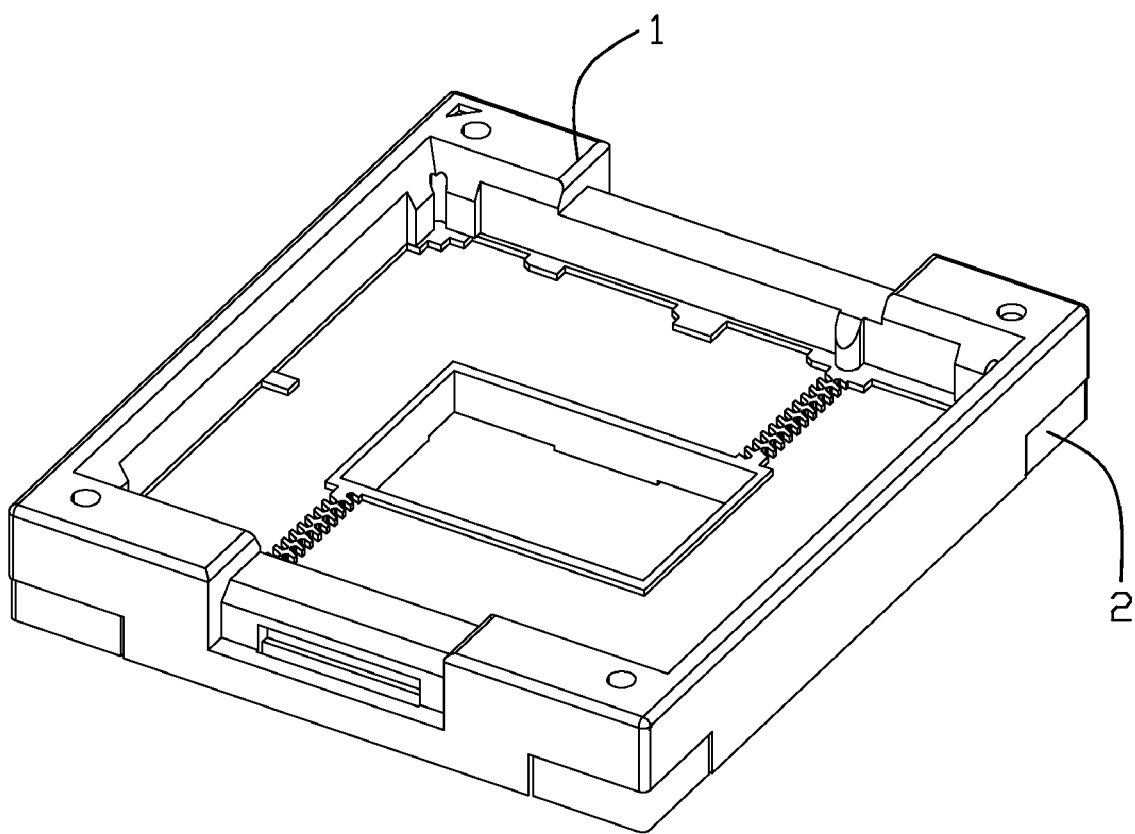
FIG. 1 is a perspective view of an frame fixes to an electrical connector.
Figure 2:
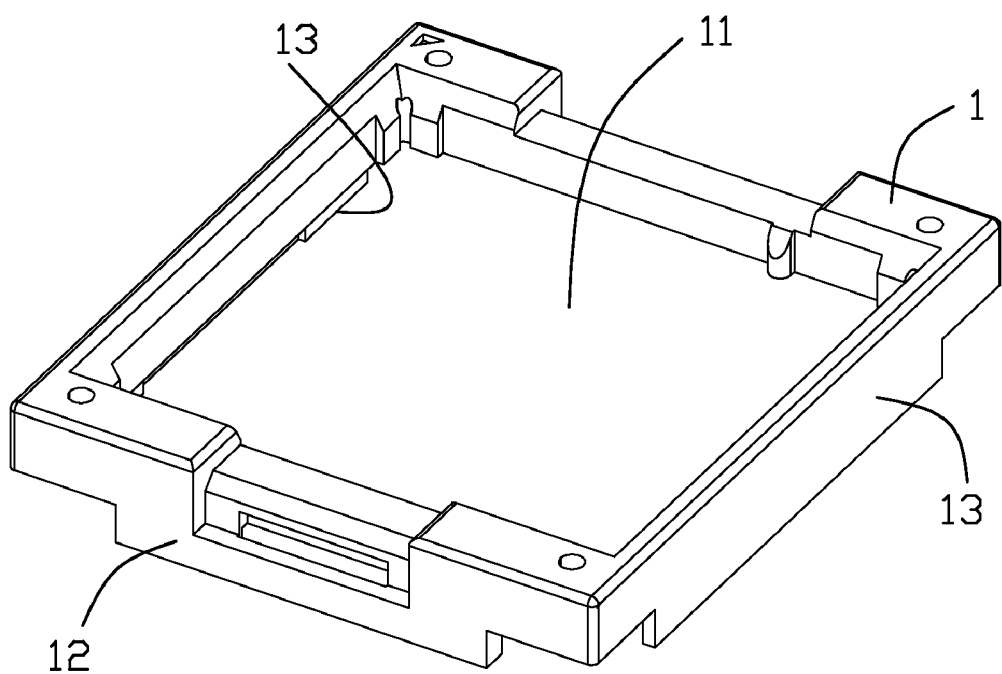
FIG. 2 is an exploded view of the frame and electrical connector.
Figure 2:
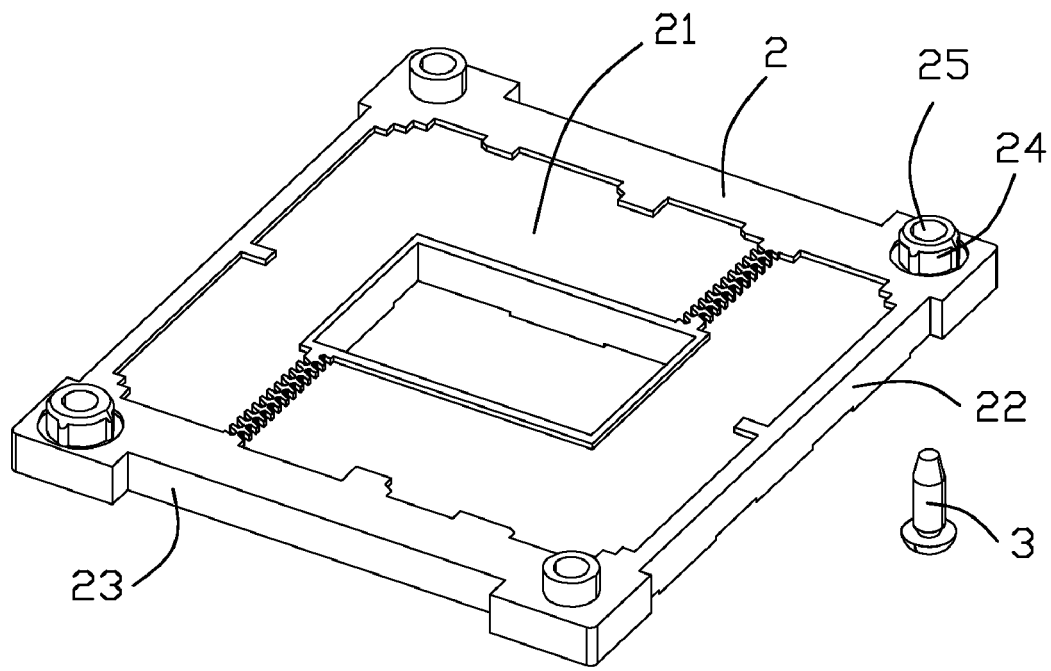
Figure 3:
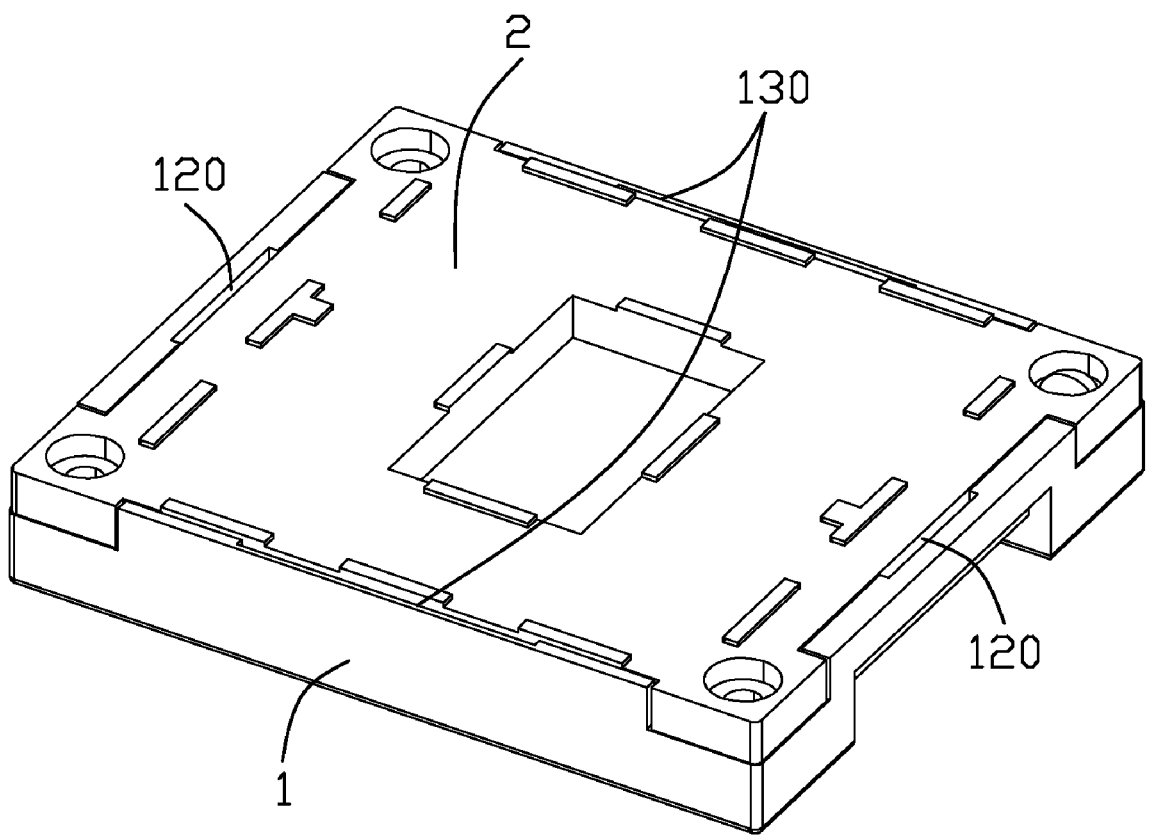
FIG. 3 is an other direction perspective view of the frame fixes to the electrical connector according to the FIG. 1.
Figure 4:
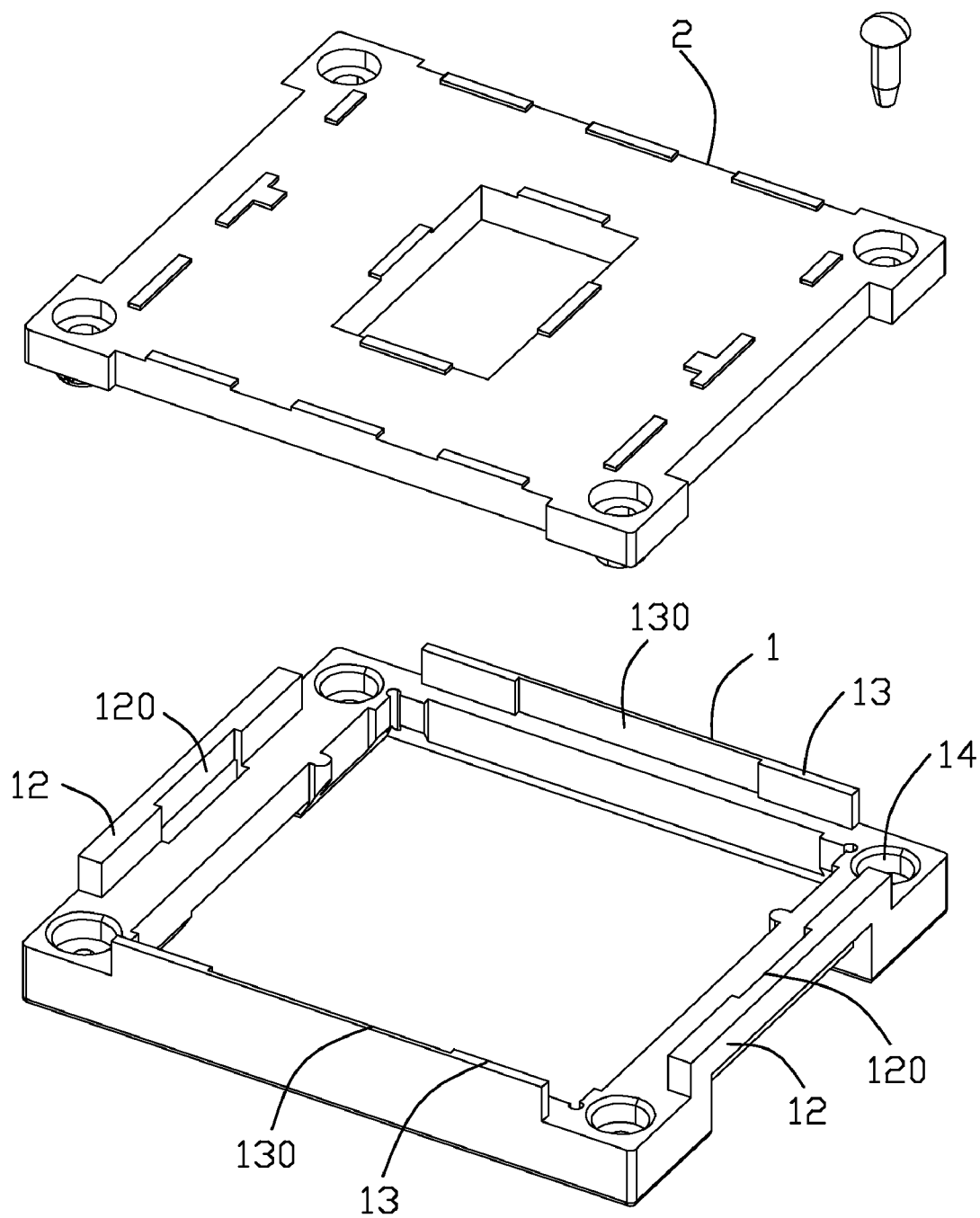
FIG. 4 an exploded view of the frame and electrical connector according to the FIG. 3.

Referring to FIGS. 1 to 4, a frame 1 is detachable from an electrical connector 2. The electrical connector 2 is disposed on a PCB (print circuit board) (not shown), and comprises a receiving portion 21 for receiving a CPU (central processing unit), a first pair of lateral sides 22 and a second pair of lateral sides 23. The electrical connector 2 has a rectangular configuration, and the rectangular electrical connector 2 has four corners (not labeled). Each of the four corners defines a post 24, respectively, and the post 24 defines a hole 25. The hole 25 extends along a vertical direction.

A plurality of terminals (not shown) are received in the receiving portion 21 so as to create an electrical path from the CPU to the PCB. And the electrical connector 2 is fixed on the PCB by a plurality of bolts 3.

The frame 1 is configured of rectangular, and comprises a pair of first retaining walls 13, a pair of second retaining walls 12 and an opening 11 which is surrounded by the first and second pairs of retaining walls 13,12. The second pair of retaining walls 12 connect with the first pair of retaining walls 13 alternatively. The frame 1 forms four passageways 14 corresponding to the four posts 24. The frame 1 will assemble to the electrical connector 2. When the frame 1 is assembling to the electrical connector 2, the four posts 24 are inserted into the four passageways 14, respectively. And the first and second pairs of retaining walls 12, 13 engage with the first and second lateral sides 22, 23, respectively. Each of the first pair of retaining walls 12 defines a first cutout 120, and each of the second pair of retaining walls 13 defines a second cutout 130. The first and second cutouts 120,130 are communication with the opening 11, and the first and second cutouts 120,130 are disposed on a middle portion of the first and second retaining walls 12,13. Then, a gap (not labeled) is create between the retaining walls 12, 13 and the lateral sides 22, 23.

The frame 1 is molded out of resin from molten plastic material. When the frame 1 is molded out, the temperature of the frame 1 is high and will cool down to room temperature. As the temperature is cooling down, the relative thin first and second retaining walls 12, 13 will warp because of the different speed of cooling. As a result, the middle portion of the first and second retaining walls 12,13 will protrudes into the opening 11, then the distance between the first pair of retaining walls 12 is reduced, so as the distance between the second pair of retaining walls 13. And the cutouts 120, 130 of the retaining walls 12, 13 will increase the said distances, so as to eliminate the influence of the middle protruding portion of the first and second retaining walls 12,13. Then the warped frame 1 will assemble to the electrical connector 2 easily, because of the first and second cutouts 120,130.

Figure 5:
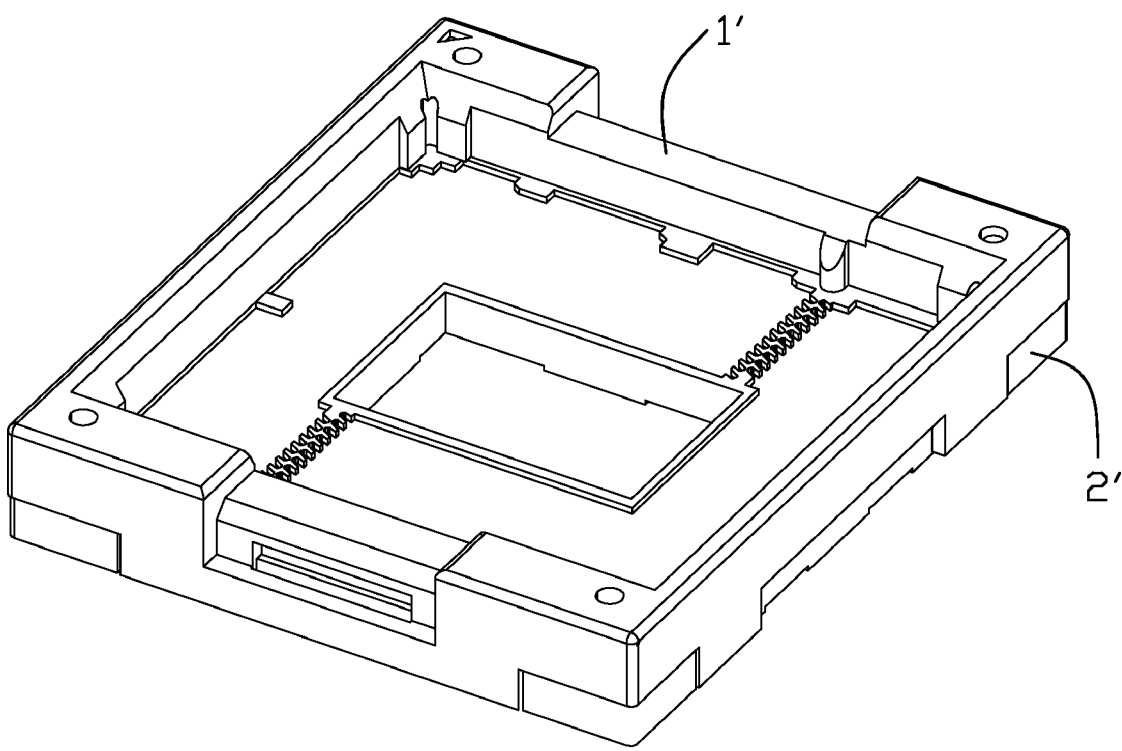
FIG. 5 is a perspective view of the frame fixes to the electrical connector, relates to a second embodiment.
Figure 6:
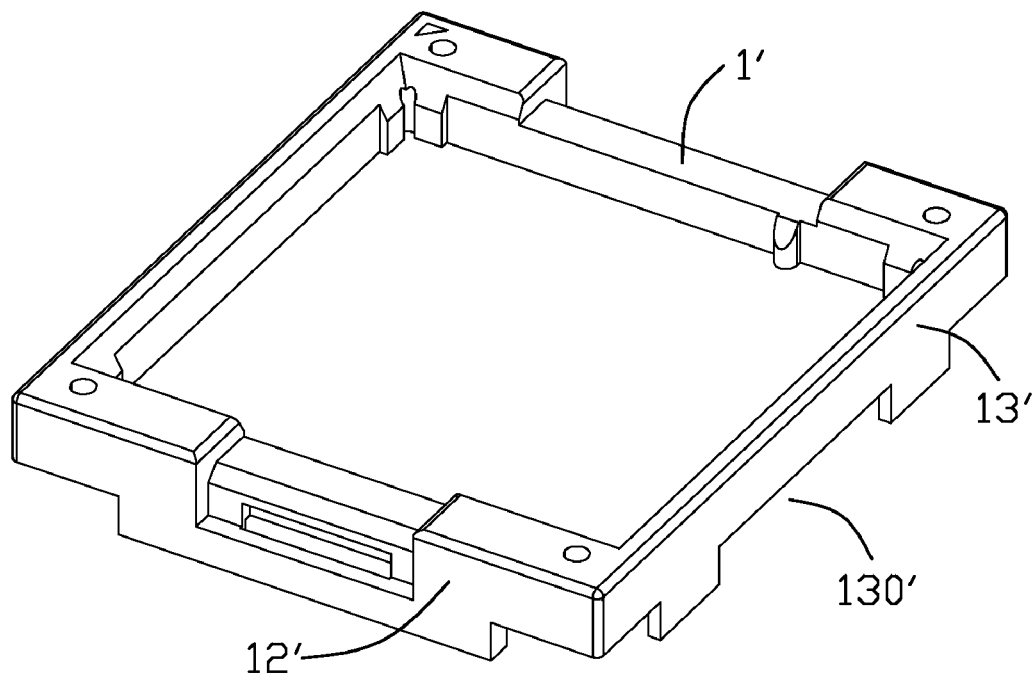
FIG. 6 is an exploded view of the frame and electrical connector, relates to the second embodiment.
Figure 6:
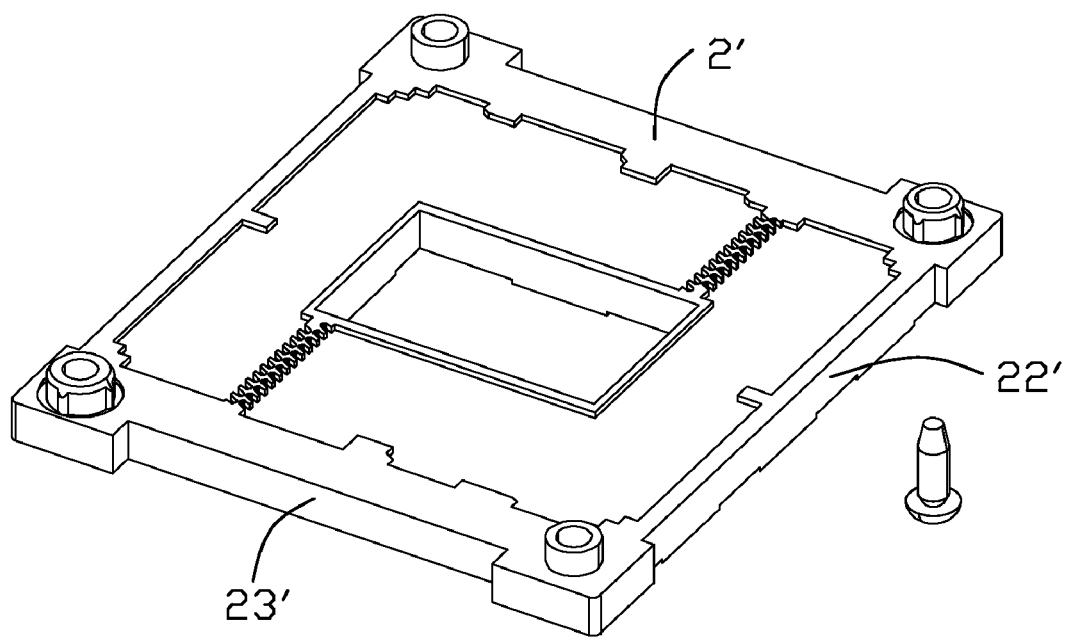

Referring to FIGS. 5 to 6, it is the second embodiment of the present invention. In this embodiment, the first and the second cutouts 120',130' of the frame 1' are cutaway, and the other structural of the electrical connector 1' and the frame 1' same with the embodiment.

In other embodiment, the cutout of the frame 1 could be disposed on electrical connector 2, and the gap between the frame 1 and the electrical connector 2 can make them easily to assemble together. They have the same function.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A frame for engaging with a connector, comprising:
a first pair of opposite retaining walls;
a second pair of opposite retaining walls; and an opening surrounded by said first and said second retaining walls; wherein
the frame is detachable from the connector and at least one pair of said first and said second pairs of opposite retaining walls are fixed on the lateral sides of the electrical connector by resiliency; and wherein
at least one retaining wall of said at least one pair of retaining walls defines a cutout, and the cutout is disposed on a middle portion of the at least one retaining wall and communicates with said opening.

2. The frame as claimed in claim 1, wherein the frame is rectangular and the first and the second opposite retaining walls are fixed to lateral sides of the electrical connector, respectively.

3. The frame as claimed in claim 2, wherein the frame defines four passageways at the corners thereof.

4. The frame as claimed in claim 1, wherein the cutout penetrates through associated retaining wall; wherein the middle portion of the first and second retaining walls protrudes into the opening, then the distance between the first pair of retaining walls is reduced, so as the distance between the second pair of retaining walls; the cutouts of the retaining walls increases said distances eliminating the influence of the middle portion of the first and second retaining walls.

5. A connector assembly, comprising:
an electrical connector for receiving a CPU; and
a frame engaging with the connector, comprising:
a first pair of opposite retaining walls;
a second pair of opposite retaining walls;
an opening surrounded by said first and second retaining walls;
wherein
the frame is detachable from the connector and at least one pair of said first and second pairs of opposite retaining walls are fixed on lateral sides of the electrical connector resiliency; and wherein
a cutout is defined between the lateral side and the retaining wall; wherein the cutout is disposed on a middle portion of the at least one retaining wall and communicates with said opening; wherein the middle portion of the first and second retaining walls protrudes into the opening, then the distance between the first pair of retaining walls is reduced, so as the distance between the second pair of retaining walls; the cutouts of the retaining walls increases said distances eliminating the influence of the middle portion of the first and second retaining walls.

6. The connector assembly as claimed in claim 5, wherein both the electrical connector and the frame are rectangular, and the first and second opposite retaining walls are fixed to the four lateral sides of the electrical connector, respectively.

7. The connector assembly as claimed in claim 5, wherein the rectangular electrical connector has four corners, and each of the four corners defines a post.

8. The connector assembly as claimed in claim 7, wherein the frame defines four passageways at the corners thereof to match said posts of the electrical connector.

9. An electrical connector assembly comprising:
an electrical connector including an insulative housing defining a plurality of lateral sides, each of said lateral sides defining a recessed area around a middle region of an exterior face thereof;
a plurality of terminals disposed in the housing;
a frame including a base defining a central opening and a plurality of retaining walls downwardly extending from a periphery of the base and facing said center opening, respectively, each of said retaining walls received in the corresponding recessed area and defining a cutout around a middle region of an interior face thereof so as to forgive inward warpage of the corresponding retaining wall and ease assembling between the frame and the connector under condition that the retaining walls intimately engage the corresponding lateral sides, respectively; Wherein said cutout extends through the corresponding retaining wall in a lateral direction to communicate with an exterior; wherein a plurality of fastening devices are located at corners of the frame to fasten the frame and the connector together; wherein the base of the frame includes a plurality of protrusions on an interior surfaces thereof for engagement with an electronic package received in the central opening.

10. The electrical connector assembly as claimed in claim 9, wherein said base of the frame defines a recess for receiving a pick-up cap.

* * * * *